United States Patent
Wang

(10) Patent No.: US 11,272,307 B2
(45) Date of Patent: Mar. 8, 2022

(54) METHOD AND DEVICE FOR CONTROLLING RECORDING VOLUME, AND STORAGE MEDIUM

(71) Applicant: Beijing Xiaomi Pinecone Electronics Co., Ltd., Beijing (CN)

(72) Inventor: Huijun Wang, Beijing (CN)

(73) Assignee: Beijing Xiaomi Pinecone Electronics Co., Ltd., Beijing (CN)

( * ) Notice: Subject to any disclaimer, the term of this patent is extended or adjusted under 35 U.S.C. 154(b) by 0 days.

(21) Appl. No.: 16/986,996

(22) Filed: Aug. 6, 2020

(65) Prior Publication Data

US 2021/0289305 A1    Sep. 16, 2021

(30) Foreign Application Priority Data

Mar. 10, 2020  (CN) .......................... 202010163122.8

(51) Int. Cl.
| H04R 5/00 | (2006.01) |
| H04S 7/00 | (2006.01) |
| G10L 15/22 | (2006.01) |
| H03G 3/24 | (2006.01) |

(52) U.S. Cl.
CPC .............. *H04S 7/301* (2013.01); *G10L 15/22* (2013.01); *H03G 3/24* (2013.01); *G10L 2015/223* (2013.01)

(58) Field of Classification Search
CPC ....................................................... H04R 5/00
See application file for complete search history.

(56) References Cited

U.S. PATENT DOCUMENTS

| 6,914,989 B2 | 7/2005 | Janse et al. |
| 2003/0076965 A1 | 4/2003 | Janse et al. |
| 2006/0147054 A1 | 7/2006 | Buck et al. |
| 2012/0106749 A1 | 5/2012 | Buck et al. |
| 2017/0345439 A1 | 11/2017 | Jensen et al. |
| 2019/0103848 A1 | 4/2019 | Shaya et al. |
| 2019/0103849 A1 | 4/2019 | Shaya et al. |
| 2019/0371330 A1 | 12/2019 | Lin et al. |
| 2020/0220511 A1 | 7/2020 | Shaya et al. |

FOREIGN PATENT DOCUMENTS

| CN | 105554674 A | 5/2016 |
| CN | 105872182 A | 8/2016 |
| CN | 107622652 A | 1/2018 |
| CN | 108510987 A | 9/2018 |
| CN | 108564947 A | 9/2018 |
| CN | 109155130 A | 1/2019 |
| CN | 109215663 A | 1/2019 |
| CN | 109257682 A | 1/2019 |

(Continued)

OTHER PUBLICATIONS

Supplementary European Search Report in the European application No. 20193328.0, dated Feb. 12, 2021.

(Continued)

*Primary Examiner* — Olisa Anwah
(74) *Attorney, Agent, or Firm* — Finnegan, Henderson, Farabow, Garrett & Dunner, L.L.P.

(57) ABSTRACT

A method for controlling a recording volume, includes: determining an adjustment gain; and calibrating at least one voice interaction apparatus based on the adjustment gain, to make the at least one voice interaction apparatus have a same recording volume under a same sound pressure level.

15 Claims, 5 Drawing Sheets

A reference apparatus and first microphone sensitivity of the reference apparatus are determined — S201

An adjustment gain is determined based on the first microphone sensitivity and second microphone sensitivity of a voice interaction apparatus — S202

(56) References Cited

FOREIGN PATENT DOCUMENTS

| | | |
|---|---|---|
| CN | 109308018 A | 2/2019 |
| CN | 109887522 A | 6/2019 |
| CN | 109979469 A | 7/2019 |
| CN | 110364153 A | 10/2019 |
| CN | 110364161 A | 10/2019 |
| JP | 2011193144 A | 9/2011 |
| JP | 2018032931 A | 3/2018 |
| KR | 20020035126 A | 5/2002 |
| WO | WO 2015114674 A1 | 8/2015 |
| WO | WO 2018/118002 A1 | 6/2018 |
| WO | WO 2019/070328 A1 | 4/2019 |

OTHER PUBLICATIONS

Notice of Reasons for Refusal of Japanese Application No. 2020-132189, dated Oct. 28, 2021.
Notification of Reason for Refusal of Korean Application No. 10-2020-0091333, dated Nov. 1, 2021.

METHOD AND DEVICE FOR CONTROLLING RECORDING VOLUME, AND STORAGE MEDIUM

CROSS-REFERENCE TO RELATED APPLICATION

This application is based upon and claims priority to Chinese Patent Application No. 202010163122.8, filed on Mar. 10, 2020, the entire content of which is incorporated herein by reference.

TECHNICAL FIELD

The present disclosure relates to the technical field of voice interaction apparatuses, and more particularly, to a method and device for controlling a recording volume, and a storage medium.

BACKGROUND

With the development of artificial intelligent technologies, voice control has become an important application in smart home scenes.

There may be a plurality of voice interaction apparatuses based on voice control in a user's house. In order to avoid concurrent responding to one instruction by the plurality of voice interaction apparatuses, a function of waking up a nearby voice interaction apparatus is typically implemented based on voice energy received or picked up by a microphone or a signal-to-noise ratio.

SUMMARY

According to a first aspect of embodiments of the disclosure, a method for controlling a recording volume, includes: determining an adjustment gain according to a preset reference index of a reference apparatus; and calibrating a recording volume of at least one voice interaction apparatus based on the adjustment gain, to make the at least one voice interaction apparatus have a same recording volume under a same sound pressure level.

According to a second aspect of embodiments of the present disclosure, a device includes: a processor; and a memory configured to store instructions executable by the processor; wherein the processor is configured to: determine an adjustment gain according to a preset reference index of a reference apparatus, and calibrate a recording volume of at least one voice interaction apparatus based on the adjustment gain, to make the at least one voice interaction apparatus have a same recording volume under a same sound pressure level.

According to a third aspect of embodiments of the present disclosure, a non-transitory computer readable storage medium has stored therein instructions that, when executed by a processor of a device, cause the device to perform a method for controlling a recording volume. The method includes: determining an adjustment gain according to a preset reference index of a reference apparatus, and calibrating a recording volume of at least one voice interaction apparatus based on the adjustment gain, to make the at least one voice interaction apparatus have a same recording volume under a same sound pressure level.

It should be understood that the above general description and the following detailed description are exemplary and explanatory only, and are not intended to limit the disclosure.

BRIEF DESCRIPTION OF THE DRAWINGS

The accompanying drawings, which are incorporated in and constitute a part of this specification, illustrate embodiments consistent with the disclosure and, together with the specification, serve to explain the principles of the disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise indicated. The implementations set forth in the following description of exemplary embodiments do not represent all implementations consistent with the disclosure. Instead, they are merely examples of apparatuses and methods consistent with aspects related to the disclosure as recited in detail in the appended claims.

Based on a function of nearby wakeup of voice interaction apparatuses, respective initial recording volumes of the voice interaction apparatuses can be collected, and such information can be saved on a decision making apparatus. After the voice interaction apparatuses pick up a voice instruction of a user, volume information picked up or recorded respectively can be uploaded to the decision making apparatus.

The decision making apparatus, based on the inquired initial recording volume of each voice interaction apparatus, can make corresponding compensation to volume information picked up by the voice interaction apparatuses. Based on compensated volume information, the decision making apparatus can determine a voice interaction apparatus with maximum signal energy or signal-to-noise ratio and determine that the voice interaction apparatus is closest to the user. The determined voice interaction apparatus then makes a response to operations of the user.

The above working mode may result in large workload of the decision making apparatus and slow down determination of the decision making apparatus. Due to limited storage space of the decision making apparatus, it may also be difficult to upload initial recording volumes of new voice interaction apparatuses to the decision making apparatus in time. The determination accuracy of the decision making apparatus may be degraded and thus, correct running of the nearby wakeup mechanism based on energy or a signal-to-noise ratio may be affected.

Embodiments of the disclosure provide a method for controlling a recording volume, also referred to herein as a method for pickup volume control. The method may achieve accurate running of the nearby wakeup mechanism based on energy or the signal-to-noise ratio.

Figure 1:
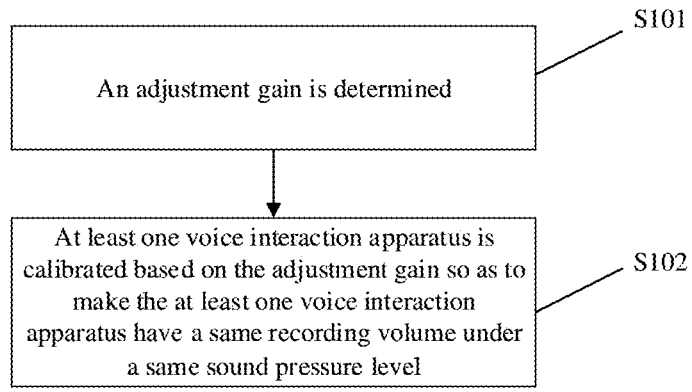
FIG. 1 is a flowchart of a method for controlling a recording volume according to an exemplary embodiment.

FIG. 1 is a flowchart of a method for controlling a recording volume according to an exemplary embodiment. The method may include the following operations.

In operation S101, an adjustment gain is determined according to a preset reference index of a reference apparatus.

An output signal can be amplified by a gain. Through setting the gain for a voice interaction apparatus, signals output by the voice interaction apparatus can be amplified.

The adjustment gain may be a hardware gain or a software gain.

In operation S102, at least one voice interaction apparatus is calibrated based on the adjustment gain, so that the at least one voice interaction apparatus has a same recording volume under a same sound pressure level.

The recording volume may correspond to a level or amplitude of a digital signal. For example, when recording is conducted by a device under a sound pressure level of 94 dB, a digital signal level generated by a 1 kHz single-frequency acoustic signal is taken as a characterization value of the recording volume.

The voice interaction apparatuses may have different acoustic hardware architectures. Hence, under the same sound pressure level, original volumes picked up by the voice interaction apparatuses may be different.

By setting corresponding adjustment gains for different voice interaction apparatuses, the voice interaction apparatuses can have a same recording volume under the same sound pressure level.

For an instance, based on the nearby wakeup mechanism, among the voice interaction apparatuses calibrated with the adjustment gain, the voice interaction apparatus picking up maximum volume information may be determined as a voice interaction apparatus to respond to a user instruction according to volume information of the user picked up by the voice interaction apparatus.

In an embodiment, the reference apparatus may be a voice interaction apparatus provided with a digital microphone (DMIC) or may also be a voice interaction apparatus provided with an analog microphone (AMIC) and an analog-to-digital converter (ADC).

Adjustment gains of different voice interaction apparatuses may be determined based on the reference apparatus, which has stability and generality.

The voice interaction apparatuses may include those provided with a DMIC and those provided with an AMIC and an ADC. Compared to the voice interaction apparatuses with an AMIC and an ADC, the voice interaction apparatuses with a DMIC do not have a hardware gain that serves as a variable and thus, have higher stability.

Figure 3:
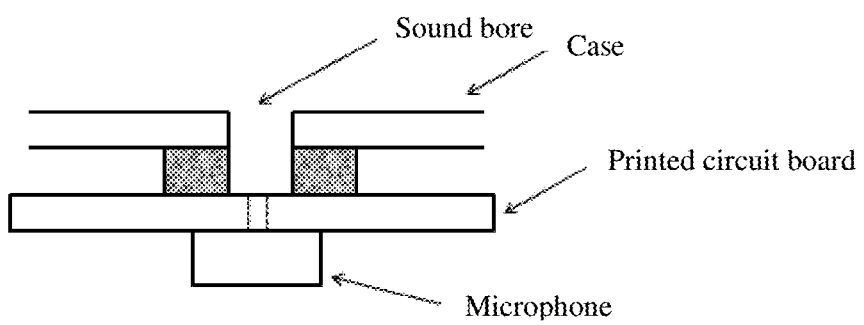
FIG. 3 is a schematic diagram of a voice interaction apparatus according to an exemplary embodiment.

FIG. 3 is a schematic diagram of a voice interaction apparatus, according to an exemplary embodiment. For example, the voice interaction apparatus is provided with a direct-sound microphone sound chamber, and may be the reference apparatus.

The direct-sound microphone sound chamber may be a direct sound chamber with a straight-line microphone sound chamber structure. In other words, a microphone picking up voice right faces a sound bore. Hence, when being propagated to the microphone, voice may not be shielded by anything, and there is no loss of voice energy.

According to the method provided by the disclosure, the voice interaction apparatuses can be calibrated with an adjustment gain, so the voice interaction apparatuses with different acoustic hardware architectures can generate a same recording volume while picking up a user voice instruction under a same sound pressure level. Accordingly, accurate running of the nearby wakeup mechanism based on energy or the signal-to-noise ratio can be achieved.

Figure 2:
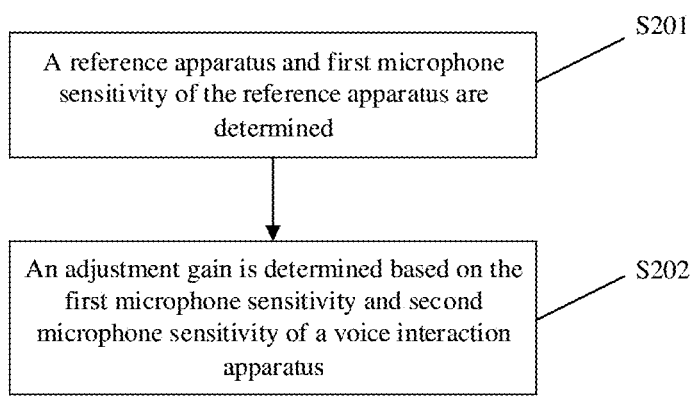
FIG. 2 is a flowchart of operations of determining an adjustment gain according to an exemplary embodiment.

FIG. 2 is a flowchart of operations of determining an adjustment gain according to an exemplary embodiment. In the present embodiment, a preset reference index may include microphone sensitivity.

In operation S201, first microphone sensitivity of a reference apparatus is determined.

The preset reference index may be also other indexes. The microphone sensitivity is taken as the example here.

The first microphone sensitivity of the reference apparatus may be acquired through inquiry of specifications of the apparatus.

In an embodiment, first microphone sensitivity of a reference apparatus provided with a direct-sound microphone sound chamber and a DMIC can be determined.

Reference apparatuses of different models, provided with direct-sound microphone sound chambers and DMICs may have different first microphone sensitivity.

The first microphone sensitivity may be a preset value, such as −26 dB. The first microphone sensitivity is not limited in the disclosure.

In operation S202, an adjustment gain is determined based on the first microphone sensitivity and second microphone sensitivity of a voice interaction apparatus.

The adjustment gain may be determined based on the first microphone sensitivity and the second microphone sensitivity. Based on the adjustment gain, recording volumes of a plurality of voice interaction apparatuses may be compensated. Hence, after picking up a user voice instruction under a same sound pressure level, the plurality of voice interaction apparatuses can generate a same recording volume.

In an exemplary embodiment, the voice interaction apparatus may include a DMIC.

The adjustment gain of the voice interaction apparatus with the DMIC may be determined according to a difference between the first microphone sensitivity and the second microphone sensitivity.

For illustrative purposes only, it is assumed that the adjustment gain is Gain*, the first microphone sensitivity is $Smic_1$ and the second microphone sensitivity is $Smic_2$. For the voice interaction apparatus with the DMIC, the adjustment gain Gain*, the first microphone sensitivity $Smic_1$ and the second microphone sensitivity $Smic_2$ can satisfy the following relationship:

$$Gain^* = Smic_1 - Smic_2.$$

The second microphone sensitivity $Smic_2$ of the voice interaction apparatus can be acquired through inquiry of specifications of the apparatus.

For example, the first microphone sensitivity $Smic_1$ may be −26 dB. If the second microphone sensitivity $Smic_2$ of the voice interaction apparatus with the DMIC is −22 dB, then Gain*=−26−(−22)=−4 dB.

Figure 4:
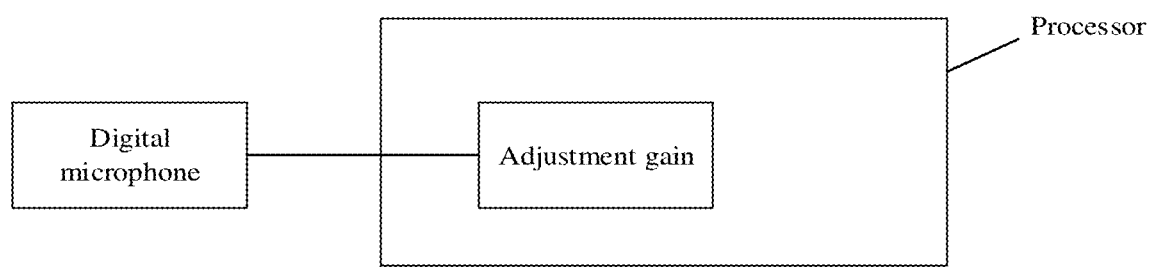
FIG. 4 is a schematic diagram of a pickup path of a voice interaction apparatus according to an exemplary embodiment.

FIG. 4 is a schematic diagram of a pickup path of a voice interaction apparatus provided with a DMIC, according to an exemplary embodiment. In the embodiment, the adjustment gain Gain* of the voice interaction apparatus provided with the DMIC is a software gain. The adjustment gain Gain* may be implemented in a processor of the voice interaction apparatus.

In an exemplary embodiment, the voice interaction apparatus may include a voice interaction apparatus provided with an AMIC and an ADC.

An adjustment gain of the voice interaction apparatus provided with the AMIC and the ADC may be determined based on first microphone sensitivity, second microphone sensitivity of the voice interaction apparatus and an analog-to-digital conversion quantified reference voltage of the voice interaction apparatus.

In an embodiment, for the voice interaction apparatus provided with the AMIC and the ADC, a difference between a sum of the analog-to-digital conversion quantified reference voltage of the voice interaction apparatus and the first microphone sensitivity and the second microphone sensitivity may be determined as the adjustment gain.

For the voice interaction apparatus provided with the AMIC and the ADC, the adjustment gain Gain*, the first microphone sensitivity $Smic_1$, the second microphone sensitivity $Smic_2$ and the analog-to-digital conversion quantified reference voltage Vref can satisfy the following relationship:

$$Gain^* = Vref + Smic_1 - Smic_2.$$

The analog-to-digital conversion quantified reference Vref may be acquired based on specifications of the ADC. For example, the analog-to-digital conversion quantified reference voltage Vref of a model t1v320adc3101 from Texas Instruments may be −3 dB.

The second microphone sensitivity $Smic_2$ of the voice interaction apparatus may be acquired according to specifications of the apparatus. For example, the second sensitivity $Smic_2$ of an AMIC of Goertek S18OB381-015 may be −38 dB.

For example, when the first microphone sensitivity $Smic_1$ is −26 dB, Gain*=−3−26−(−38)=+9 dB.

Figure 5:
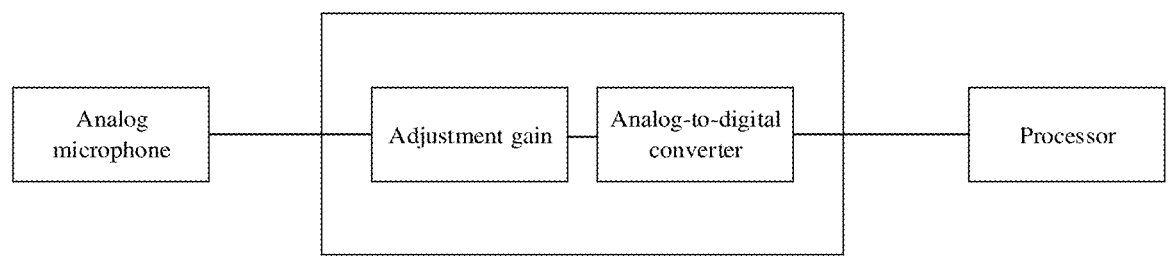
FIG. 5 is a schematic diagram of a pickup path of a voice interaction apparatus according to an exemplary embodiment.

FIG. 5 is a schematic diagram of a pickup path of a voice interaction apparatus provided with an AMIC and an ADC, according to an exemplary embodiment. In the embodiment, the adjustment gain Gain* of the voice interaction apparatus provided with the AMIC and the ADC is a hardware gain.

The adjustment gain Gain* may be acquired through adjustment of a gain module of a pre-amplifier Pre-AMP or a programmable gain amplifier PGA integrated with an ADC module ADC.

Figure 6:
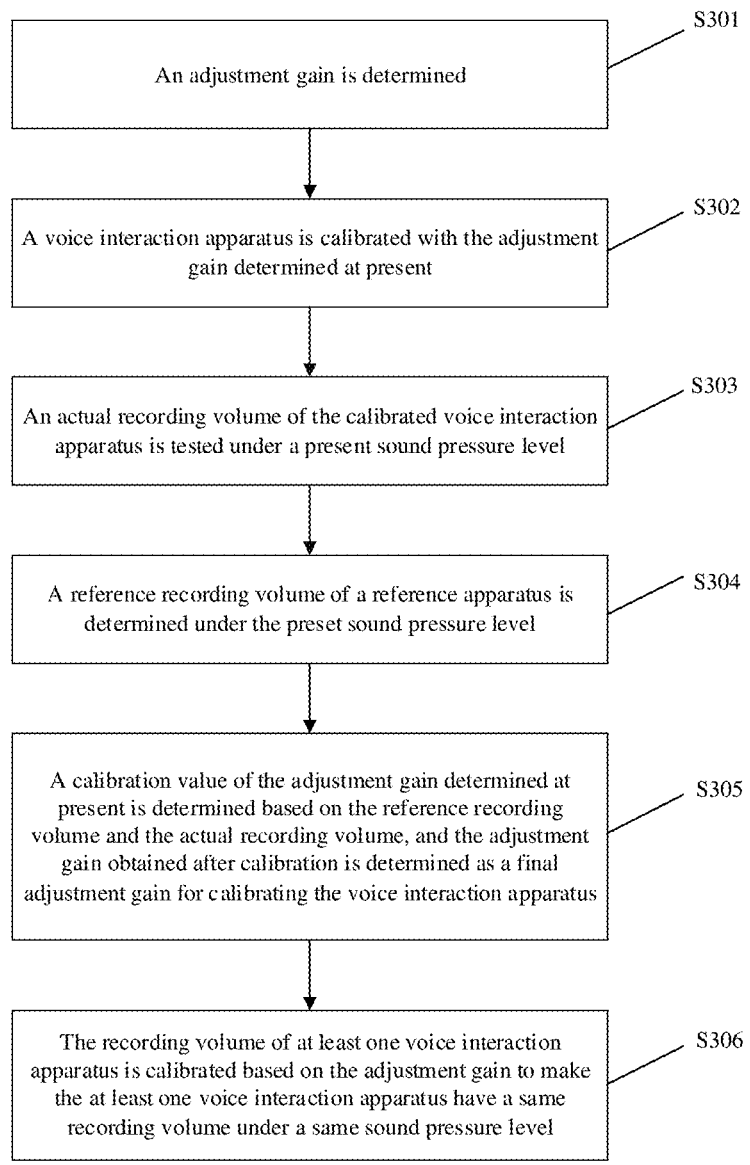
FIG. 6 is a flowchart of a method for controlling a recording volume according to an exemplary embodiment.

FIG. 6 is a flowchart of a method for controlling a recording volume according to an exemplary embodiment. As shown in FIG. 6, the method may include the following operations.

In operation S301, the adjustment gain is determined according to a preset reference index of a reference apparatus. In operation S306, based on the adjustment gain, a recording volume of at least one voice interaction apparatus is calibrated, so that the at least one voice interaction apparatus has a same recording volume under a same sound pressure level. During determination of the adjustment gain according to the preset reference index of the reference apparatus, an index value of the preset reference index may be a theoretical index value. For example, the index value of the preset reference index may be acquired from a product instruction, and the adjustment gain is determined based on the theoretical index value. However, in actual production and design of a product, there may be a small error between an index value of a finished product in actual use and an index value in a product instruction. In order to make the acquired adjustment gain more accurate, the adjustment gain can be calibrated for an actual product after being determined based on the theoretical index value of the preset reference index. The adjustment gain obtained after calibration is taken as an adjustment gain finally used for calibrating the recording volume of the voice interaction apparatus in operation S306. The calibration of the adjustment gain may be implemented by operations S302-S305, as follows.

In operation S302, the adjustment gain currently determined at operation S301, referred to as the current adjustment gain, is used to calibrate the voice interaction apparatus.

In operation S303, an actual recording volume of the calibrated voice interaction apparatus is tested under a preset sound pressure level.

In an embodiment, the preset sound pressure level may be a sound pressure level of 94 dB. The preset sound pressure level may be adjusted according to actual situations, and is not limited in the disclosure.

Under the sound pressure level of 94 dB, the actual recording volume of the voice interaction apparatus which is already calibrated with the adjustment gain is tested to be S1.

In operation S304, a reference recording volume of the reference apparatus under the preset sound pressure level is determined.

In an embodiment, the reference recording volume of the voice interaction apparatus with a direct-sound microphone sound chamber, which has a sensitivity of x dB and a DMIC, is determined to be S0 under the sound pressure level of y dB, where x and y are integers. For example, x may be −26, and y may be 94. Accordingly, the reference recording volume of the reference apparatus with the direct-sound microphone sound chamber, which has a sensitivity of −26 dB and the DMIC, is determined S0 under the sound pressure level of 94 dB.

In operation S305, based on the reference recording volume and an actual recording volume, a calibration value of the current adjustment gain is further determined; and the calibrated adjustment gain is determined as the final adjustment gain for calibrating the voice interaction apparatus.

For example, for the voice interaction apparatus provided with the DMIC, the current adjustment gain Gain* is $Smic_1 - Smic_2$.

Also for example, for the voice interaction apparatus provided with the AMIC and the ADC, the current adjustment gain Gain* is $Vref + Smic_1 - Smic_2$.

Based on the reference recording volume S0 and the actual recording volume S1, the calibration value of the current adjustment gain Gain* can be further determined. The current adjustment gain Gain* can be calibrated with the calibration value. The recording volume of the voice interaction apparatus may be calibrated based on the calibrated adjustment gain Gain*. Thus, the accuracy for the plurality of voice interaction apparatuses to generate the same recording volume after picking up a user instruction under the same sound pressure level is further increased, even the difference in the recording volumes generated by the plurality of voice interaction apparatuses is zero or very small.

Figure 7:
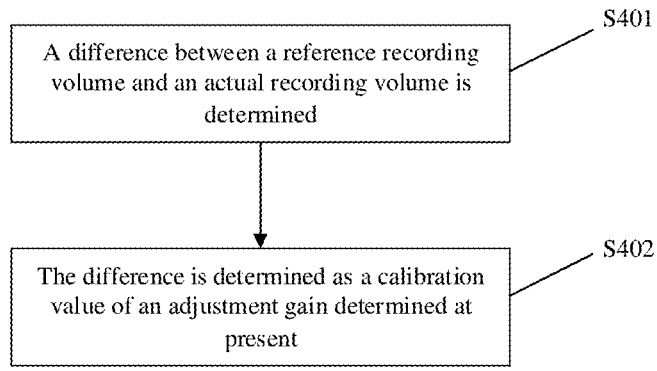
FIG. 7 is a flowchart of operations of determining a calibration value of a present adjustment gain according to an exemplary embodiment.

FIG. 7 is a flowchart of operations of determining a calibration value of a current adjustment gain, according to an exemplary embodiment. As shown in FIG. 7, the operations of determining the calibration value of the current adjustment gain based on the a reference recording volume and an actual recording volume include the following operations.

In operation S401, a difference between the reference recording volume and the actual recording volume is determined.

In operation S402, the difference is determined as the calibration value of the current adjustment gain.

For example, the calibration value of the current adjustment gain Gain* is (S0−S1).

In the embodiment, the calibrated adjustment gain Gain*', the current adjustment gain Gain*, and the calibration value (S0−S1) can satisfy the following relationship:

$$Gain*'=Gain*+(S0-S1).$$

For example, S0 and S1 may be represented by peak levels of recording signals at the frequent of 1 kHz.

After being processed with the method in the embodiments of the disclosure, the voice volumes picked up by each of the voice interaction apparatuses under a user instruction with a same sound pressure level can be the same.

A distance between a user and a voice interaction apparatus is in positive correlation with a sound pressure level of a user instruction picked up from the user. Furthermore, the distance between the user and the voice interaction apparatus is in positive correlation with a voice volume picked up by the voice interaction apparatus.

Thus, when distances between a user and voice interaction apparatuses are different, the voice interaction apparatus nearest to the user may pick up a user voice instruction with a maximum sound pressure level in comparison with other voice interaction apparatuses. Based on the nearby wakeup mechanism, the voice interaction apparatus picking up the user voice instruction with the maximum sound pressure level may be determined as the voice interaction apparatus needing to respond to the user instruction.

Figure 8:
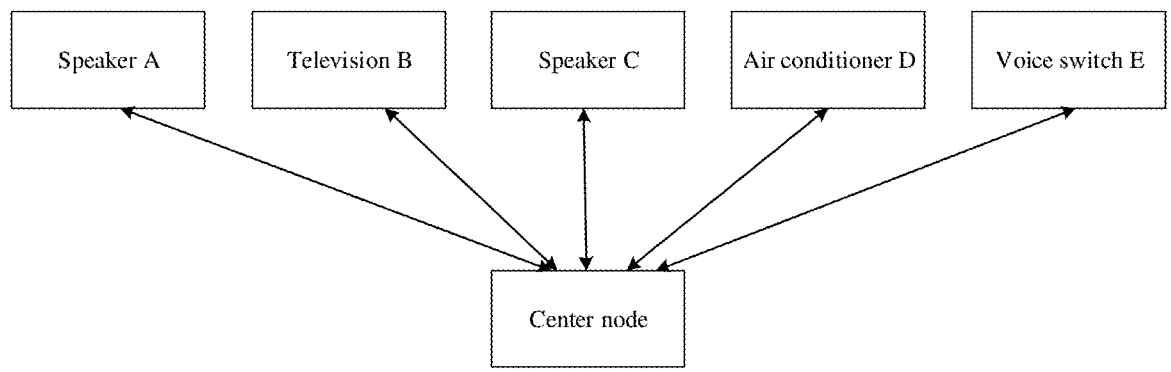
FIG. 8 is a schematic diagram of a nearby wakeup mechanism based on energy or a signal-to-noise ratio according to an exemplary embodiment.

FIG. 8 is a schematic diagram of a nearby wakeup mechanism based on energy or a signal-to-noise ratio, according to an exemplary embodiment. As shown in FIG. 8, the voice interaction apparatuses may include a speaker A, a television B, a speaker C, an air conditioner D, and a voice switch E.

A center node may be a voice interaction apparatus or may be a network center apparatus such as a gateway or a router, serving as a judgment apparatus.

After each of the voice interaction apparatuses uploads a picked voice volume of a user instruction to the center node serving as the judgment apparatus, the center node may judge which voice interaction apparatus picks up the user instruction with a maximum sound pressure level (or voice volume) and determine the voice interaction apparatus as the voice interaction apparatus needing to respond to the user instruction and determine other apparatuses as apparatuses for continuous dormancy.

Furthermore, the center node may feed back a command instruction to the corresponding voice interaction apparatus, to enable the voice interaction apparatus picking up the used instruction with the maximum sound pressure level (or voice volume) to respond to the user instruction, and make other voice interaction apparatuses continue dormancy.

Figure 9:
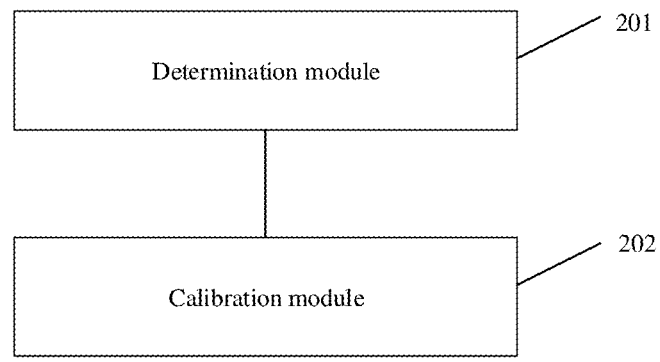
FIG. 9 is a block diagram of a device for controlling a recording volume according to an exemplary embodiment.

FIG. 9 is a block diagram of a device for controlling a recording volume according to an exemplary embodiment. As shown in FIG. 9, the device includes a determination module 201 and a calibration module 202. Each of these modules may be implemented as software, or hardware, or a combination of software and hardware.

The determination module 201 is configured to determine an adjustment gain according to a preset reference index of a reference apparatus.

The calibration module 202 is configured to, based on the adjustment gain, calibrate a recording volume of at least one voice interaction apparatus so as to make the at least one voice interaction apparatus have a same recording volume under a same sound pressure level.

In an exemplary embodiment, the determination module 201 is configured to determine first microphone sensitivity of the reference apparatus, the preset reference index including microphone sensitivity; and determine the adjustment gain based on the first microphone sensitivity and second microphone sensitivity of the voice interaction apparatus.

In an exemplary embodiment, the voice interaction apparatus may include a DMIC. The determination module 201 is configured to determine a difference between the first microphone sensitivity and the second microphone sensitivity as the adjustment gain.

In an exemplary embodiment, the voice interaction apparatus may include a voice interaction apparatus provided with an AMIC and an ADC. The determination module 201 is configured to determine the adjustment gain based on the first microphone sensitivity, the second microphone sensitivity of the voice interaction apparatus and an analog-to-digital conversion quantified reference voltage of the voice interaction apparatus.

In an exemplary embodiment, the determination module 201 is configured to determine a difference between a sum of the analog-to-digital conversion quantified reference voltage of the voice interaction apparatus plus the first microphone sensitivity and the second microphone sensitivity as the adjustment gain.

In an exemplary embodiment, the determination module 201 is configured to: calibrate the voice interaction apparatus with the currently determined adjustment gain, referred to herein as the current adjustment gain; test an actual recording volume of the calibrated voice interaction apparatus under a preset sound pressure level; determine a reference recording volume of the reference apparatus under the preset sound pressure level; and determine a calibration value of the current adjustment gain based on the reference recording volume and the actual recording volume, and determine the adjustment gain obtained after calibration as a final adjustment gain for calibrating the voice interaction apparatus.

In an exemplary embodiment, the determination module 201 is configured to determine a difference between the reference recording volume and the actual recording volume, and determine the difference as the calibration value of the current adjustment gain.

In an exemplary embodiment, the reference apparatus may be a voice interaction apparatus provided with a DMIC; and/or the reference apparatus may be a voice interaction apparatus provided with a direct-sound microphone sound chamber.

With respect to the device in the above embodiments, the specific manners for performing operations by the individual modules have been described in detail in the method embodiments, which will not be repeated herein.

Figure 10:
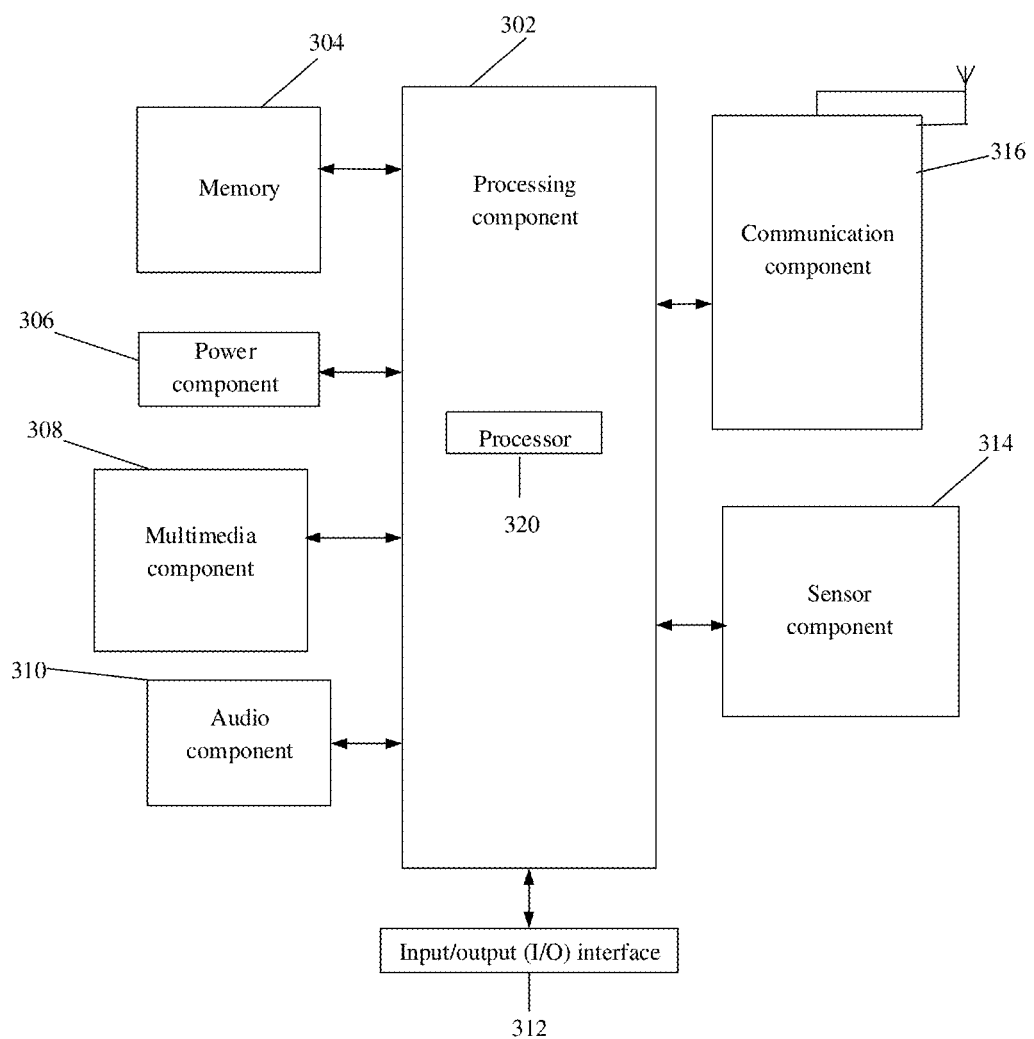
FIG. 10 is a block diagram of a device for controlling a recording volume according to an exemplary embodiment.

FIG. 10 is a block diagram of a device for controlling a recording volume, according to an exemplary embodiment. For example, the device may be a mobile phone, a computer, a digital broadcast terminal, a messaging device, a gaming console, a tablet, a medical device, exercise equipment, a personal digital assistant, and the like.

Referring to FIG. 10, the device may include one or more of the following components: a processing component 302, a memory 304, a power component 306, a multimedia component 308, an audio component 310, an input/output (I/O) interface 312, a sensor component 314, and a communication component 316.

The processing component 302 typically controls overall operations of the device, such as the operations associated with display, telephone calls, data communications, camera operations, and recording operations. The processing component 302 may include one or more processors 320 to execute instructions to perform all or part of the operations in the above described methods. Moreover, the processing component 302 may include one or more modules which facilitate the interaction between the processing component 302 and other components. For instance, the processing component 302 may include a multimedia module to facilitate the interaction between the multimedia component 308 and the processing component 302.

The memory 304 is configured to store various types of data to support the operation of the device. Examples of such data include instructions for any applications or methods operated on the device, contact data, phonebook data, messages, pictures, video, etc. The memory 304 may be implemented using any type of volatile or non-volatile memory devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or optical disk.

The power component 306 provides power to various components of the device. The power component 306 may include a power management system, one or more power sources, and any other components associated with the generation, management, and distribution of power in the device.

The multimedia component 308 includes a screen providing an output interface between the device and the user. In some embodiments, the screen may include a liquid crystal display (LCD) and a touch panel (TP). If the screen includes the touch panel, the screen may be implemented as a touch screen to receive input signals from the user. The touch panel includes one or more touch sensors to sense touches, swipes, and gestures on the touch panel. The touch sensors may not only sense a boundary of a touch or swipe action, but also sense a period of time and a pressure associated with the touch or swipe action. In some embodiments, the multimedia component 308 includes a front camera and/or a rear camera. The front camera and the rear camera may receive an external multimedia datum while the device is in an operation mode, such as a photographing mode or a video mode. Each of the front camera and the rear camera may be a fixed optical lens system or have focus and optical zoom capability.

The audio component 310 is configured to output and/or input audio signals. For example, the audio component 310 includes a microphone ("MIC") configured to receive an external audio signal when the device is in an operation mode, such as a call mode, a recording mode, and a voice recognition mode. The received audio signal may be further stored in the memory 304 or transmitted via the communication component 316. In some embodiments, the audio component 310 further includes a speaker to output audio signals.

The I/O interface 312 provides an interface between the processing component 302 and peripheral interface modules, such as a keyboard, a click wheel, buttons, and the like. The buttons may include, but are not limited to, a home button, a volume button, a starting button, and a locking button.

The sensor component 314 includes one or more sensors to provide status assessments of various aspects of the device. For instance, the sensor component 314 may detect an open/closed status of the device, relative positioning of components, e.g., the display and the keypad, of the device, a change in position of the device or a component of the device, a presence or absence of user contact with the device, an orientation or an acceleration/deceleration of the device, and a change in temperature of the device. The sensor component 314 may include a proximity sensor configured to detect the presence of nearby objects without any physical contact. The sensor component 314 may also include a light sensor, such as a CMOS or CCD image sensor, for use in imaging applications. In some embodiments, the sensor component 314 may also include an accelerometer sensor, a gyroscope sensor, a magnetic sensor, a pressure sensor, or a temperature sensor.

The communication component 316 is configured to facilitate communication, wired or wirelessly, between the device and other devices. The device can access a wireless network based on a communication standard, such as WiFi, 4G, or 5G, or a combination thereof. In one exemplary embodiment, the communication component 316 receives a broadcast signal or broadcast associated information from an external broadcast management system via a broadcast channel In one exemplary embodiment, the communication component 316 further includes a near field communication (NFC) module to facilitate short-range communications. In one exemplary embodiment, the communication component 316 may be implemented based on a radio frequency identification (RFID) technology, an infrared data association (IrDA) technology, an ultra-wideband (UWB) technology, a Bluetooth (BT) technology, and other technologies.

In exemplary embodiments, the device may be implemented with one or more application specific integrated circuits (ASICs), digital signal processors (DSPs), digital signal processing devices (DSPDs), programmable logic devices (PLDs), field programmable gate arrays (FPGAs), controllers, micro-controllers, microprocessors, or other electronic components, for performing the above described methods.

In exemplary embodiments, there is also provided a non-transitory computer-readable storage medium including instructions, such as included in the memory 304, executable by the processor 320 in the device, for performing the above-described methods. For example, the non-transitory computer-readable storage medium may be a ROM, a CD-ROM, a magnetic tape, a floppy disc, an optical data storage device, and the like.

Although the operations are described in specific sequences as shown in the diagrams, it does not mean that the operations must be executed according to the displayed sequences or serial sequences, or all the displayed operations need to be executed for realization of an expected result. In some embodiments, concurrently performing a plurality of operations may be beneficial.

Other embodiments of the disclosure will be apparent to those skilled in the art from consideration of the specification and practice of the disclosure disclosed here. This application is intended to cover any variations, uses, or adaptations of the disclosure following the general principles thereof and including such departures from the present disclosure as come within known or customary practice in the art. It is intended that the specification and examples be considered as exemplary only, with a true scope and spirit of the disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the disclosure only be limited by the appended claims.

What is claimed is:

1. A method for controlling a recording volume, comprising:
   determining an adjustment gain according to a preset reference index of a reference apparatus; and
   calibrating a recording volume of at least one voice interaction apparatus based on the adjustment gain, to make the at least one voice interaction apparatus have a same recording volume under a same sound pressure level,
   wherein the preset reference index comprises microphone sensitivity, and determining the adjustment gain according to the preset reference index of the reference apparatus comprises:
      determining first microphone sensitivity of the reference apparatus; and
      determining the adjustment gain based on the first microphone sensitivity of the reference apparatus and second microphone sensitivity of the at least one voice interaction apparatus,
   wherein the reference apparatus is a voice interaction apparatus provided with at least one of a digital microphone or a direct-sound microphone sound chamber.

2. The method of claim 1, wherein the at least one voice interaction apparatus comprises a digital microphone; and determining the adjustment gain based on the first microphone sensitivity of the reference apparatus and the second microphone sensitivity of the at least one voice interaction apparatus comprises:
   determining a difference between the first microphone sensitivity and the second microphone sensitivity as the adjustment gain.

3. The method of claim 1, wherein the at least one voice interaction apparatus comprises a voice interaction apparatus provided with an analog microphone and an analog-to-digital converter; and determining the adjustment gain based on the first microphone sensitivity of the reference apparatus and the second microphone sensitivity of the at least one voice interaction apparatus comprises:
   determining the adjustment gain based on the first microphone sensitivity of the reference apparatus, the second microphone sensitivity of the at least one voice interaction apparatus, and an analog-to-digital conversion quantified reference voltage of the at least one voice interaction apparatus.

4. The method of claim 3, wherein determining the adjustment gain based on the first microphone sensitivity of the reference apparatus, the second microphone sensitivity of the at least one voice interaction apparatus, and the analog-to-digital conversion quantified reference voltage of the at least one voice interaction apparatus comprises:
   determining, as the adjustment gain, a difference between a sum of the analog-to-digital conversion quantified reference voltage of the at least one voice interaction apparatus plus the first microphone sensitivity and the second microphone sensitivity.

5. The method of claim 1, after determining the adjustment gain, the method further comprising:
   calibrating the at least one voice interaction apparatus with the determined adjustment gain as a current adjustment gain;
   testing an actual recording volume of the calibrated voice interaction apparatus under a preset sound pressure level;
   determining a reference recording volume of the reference apparatus under the preset sound pressure level;
   determining a calibration value of the current adjustment gain based on the reference recording volume and the actual recording volume; and
   determining an adjustment gain obtained after calibration as a final adjustment gain for calibrating the at least one voice interaction apparatus.

6. The method of claim 5, wherein determining the calibration value of the current adjustment gain based on the reference recording volume and the actual recording volume comprises:
   determining a difference between the reference recording volume and the actual recording volume, as the calibration value of the current adjustment gain.

7. A device, comprising:
   a processor; and
   a memory configured to store instructions executable by the processor;
   wherein the processor is configured to:
   determine an adjustment gain according to a preset reference index of a reference apparatus; and
   calibrate a recording volume of at least one voice interaction apparatus based on the adjustment gain, to make the at least one voice interaction apparatus have a same recording volume under a same sound pressure level,
   wherein the preset reference index comprises microphone sensitivity, and in determining the adjustment gain according to the preset reference index of the reference apparatus, the processor is further configured to:
      determine first microphone sensitivity of the reference apparatus; and
      determine the adjustment gain based on the first microphone sensitivity of the reference apparatus and second microphone sensitivity of the at least one voice interaction apparatus,
   wherein the reference apparatus is a voice interaction apparatus provided with at least one of a digital microphone or a direct-sound microphone sound chamber.

8. The device of claim 7, wherein the at least one voice interaction apparatus comprises a digital microphone, and the processor is further configured to determine a difference between the first microphone sensitivity and the second microphone sensitivity as the adjustment gain.

9. The device of claim 7, wherein the at least one voice interaction apparatus comprises a voice interaction apparatus provided with an analog microphone and an analog-to-digital converter, and the processor is further configured to determine the adjustment gain based on the first microphone sensitivity of the reference apparatus, the second microphone sensitivity of the at least one voice interaction apparatus, and an analog-to-digital conversion quantified reference voltage of the at least one voice interaction apparatus.

10. The device of claim 9, wherein the processor is further configured to determine, as the adjustment gain, a difference between a sum of the analog-to-digital conversion quantified reference voltage of the at least one voice interaction apparatus plus the first microphone sensitivity and the second microphone sensitivity.

11. The device of claim 7, wherein the processor is further configured to:
- calibrate the at least one voice interaction apparatus with the determined adjustment gain as the current adjustment gain;
- test an actual recording volume of the calibrated voice interaction apparatus under a preset sound pressure level;
- determine a reference recording volume of the reference apparatus under the preset sound pressure level;
- determine a calibration value of the current adjustment gain based on the reference recording volume and the actual recording volume; and
- determine the adjustment gain obtained after calibration as a final adjustment gain for calibrating the at least one voice interaction apparatus.

12. The device of claim 11, wherein the processor is further configured to:
- determine a difference between the reference recording volume and the actual recording volume, as the calibration value of the current adjustment gain.

13. The device of claim 7, being a mobile terminal.

14. A non-transitory computer readable storage medium having stored thereon instructions that, when executed by a processor of a device, cause the device to perform a method for controlling a recording volume, the method comprising:
- determining an adjustment gain according to a preset reference index of a reference apparatus; and
- calibrating a recording volume of at least one voice interaction apparatus based on the adjustment gain, to make the at least one voice interaction apparatus have a same recording volume under a same sound pressure level,
- wherein the preset reference index comprises microphone sensitivity, and determining the adjustment gain according to the preset reference index of the reference apparatus comprises:
  - determining first microphone sensitivity of the reference apparatus; and
  - determining the adjustment gain based on the first microphone sensitivity of the reference apparatus and second microphone sensitivity of the at least one voice interaction apparatus,
- wherein the reference apparatus is a voice interaction apparatus provided with at least one of a digital microphone or a direct-sound microphone sound chamber.

15. The non-transitory computer readable storage medium of claim 14, wherein the at least one voice interaction apparatus comprises a digital microphone, and determining the adjustment gain based on the first microphone sensitivity of the reference apparatus and the second microphone sensitivity of the at least one voice interaction apparatus comprises:
- determining a difference between the first microphone sensitivity and the second microphone sensitivity as the adjustment gain.

* * * * *